United States Patent
Liao

(10) Patent No.: US 6,294,314 B2
(45) Date of Patent: *Sep. 25, 2001

(54) METHOD OF FABRICATING AN OPENING WITH DEEP ULTRA-VIOLET PHOTORESIST

(75) Inventor: Kuan-Yang Liao, Taipei (TW)

(73) Assignee: United Silicon Incorporated, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,243

(22) Filed: May 11, 1998

(30) Foreign Application Priority Data

Apr. 21, 1998 (TW) ................................. 87106062

(51) Int. Cl.⁷ ........................................... G03F 7/00
(52) U.S. Cl. ............................ 430/313; 430/317; 216/49
(58) Field of Search ................................. 430/313, 314, 430/317, 324; 216/49

(56) References Cited

U.S. PATENT DOCUMENTS

| 4,999,280 | * | 3/1991 | Hiraoka ................................. 430/330 |
| 5,041,362 | * | 8/1991 | Douglas ................................. 430/313 |
| 5,217,851 | * | 6/1993 | Kishimura et al. ................... 430/325 |
| 5,487,967 | * | 1/1996 | Hutton ................................... 430/322 |
| 5,863,707 | * | 1/1999 | Lin ......................................... 430/313 |
| 5,876,903 | * | 3/1999 | Ng et al. ............................... 430/313 |
| 5,895,740 | * | 4/1999 | Chien et al. .......................... 430/313 |

FOREIGN PATENT DOCUMENTS 61-151533 * 7/1986 (JP).

* cited by examiner

Primary Examiner—Kathleen Duda
(74) Attorney, Agent, or Firm—Christie, Parker & Hale, LLP

(57) ABSTRACT

A method of fabricating an opening with a deep ultra-violet photoresist layer. An insulating layer is formed on a substrate having a device structure. A deep ultra-violet photoresist layer with a first opening is formed on the insulating layer and a hard mask layer is then formed on the surface and the sidewalls of the deep ultra-violet photoresist layer. The first opening is used to pattern the insulating layer to form a second opening within the insulating layer wherein the hard mask layer is to protect the deep ultra-violet photoresist layer. The deep ultra-violet photoresist layer and the hard mask layer are removed to expose the insulating layer and a desired opening is thus accomplished.

18 Claims, 2 Drawing Sheets

METHOD OF FABRICATING AN OPENING WITH DEEP ULTRA-VIOLET PHOTORESIST

CROSS-REFERENCE TO RELATED APPLICATION

This application claims priority benefit of Taiwan application Serial No. 87106062, filed Apr. 21, 1998, the full disclosure of which is incorporated herein by reference.

BACKGROUND OF THE INVENTION

1. Field of the Invention

The invention relates to a method of fabricating an opening, and more particularly to a method of fabricating an opening formed by deep ultra-violet photoresist (DUV PR).

2. Description of the Related Art

Deep ultra-violet photoresist is necessary for the semiconductor process with the size of 0.25 $\mu$m or less. It can be employed in, for example, oxide layer etching. The DUV PR is exposed under a deep ultra-violet light and developed to define the oxide layer. An opening for a contact, via or damascene is then formed by developing the DUV PR. DUV PR is used to reduce the width of the opening but the material of the DUV PR is soft and not high temperature compatible. Thus erosion and reflow of the DUV PR easily occurs while etching the oxide layer which requires high ion energy. Thus, the side profile of the DUV PR isn't entirely vertical and it is difficult to precisely control the width of the opening. A commonly employed method of preventing overetching of the DUV PR is to increase the thickness of the DUV PR. However, the increment of the thickness prevents the photoresist from being properly exposed and successfully developed, because of focus of depth. Therefore increasing the thickness of the DUV PR as described above doesn't solve the problem.

SUMMARY OF THE INVENTION

It is therefore an object of the invention to overcome the problem of erosion and reflow of the DUV PR. The width of the opening can be reduced as much as possible to follow the trend towards smaller size. The quality of the opening width can also be controlled in a stable fashion.

To achieve these objects and advantages, and in accordance with the purpose of the invention, as embodied and broadly described herein, the invention is directed towards a method of fabricating an opening with deep ultra-violet photoresist. An insulating layer is formed over a substrate where devices are formed thereon. A DUV PR layer with a first opening is then formed on the insulating layer. A hard mask layer is formed on the DUV PR layer and a second opening is next formed within the insulating layer by using the first opening to define the insulating layer. The hard mask is used to protect the DUV PR layer. The DUV PR layer and the hard mask are removed to expose the insulating layer and a desired second opening is thus formed.

It is to be understood that both the foregoing general description and the following detailed description are exemplary and explanatory only and are not restrictive of the invention, as claimed.

DESCRIPTION OF THE PREFERRED EMBODIMENTS

This invention is about a method of fabricating an opening within the insulating layer. In the semiconductor process, the opening for the contact, via or damascene can be formed by this invention. The example below is made in reference to an opening for a via.

Figure 1A:
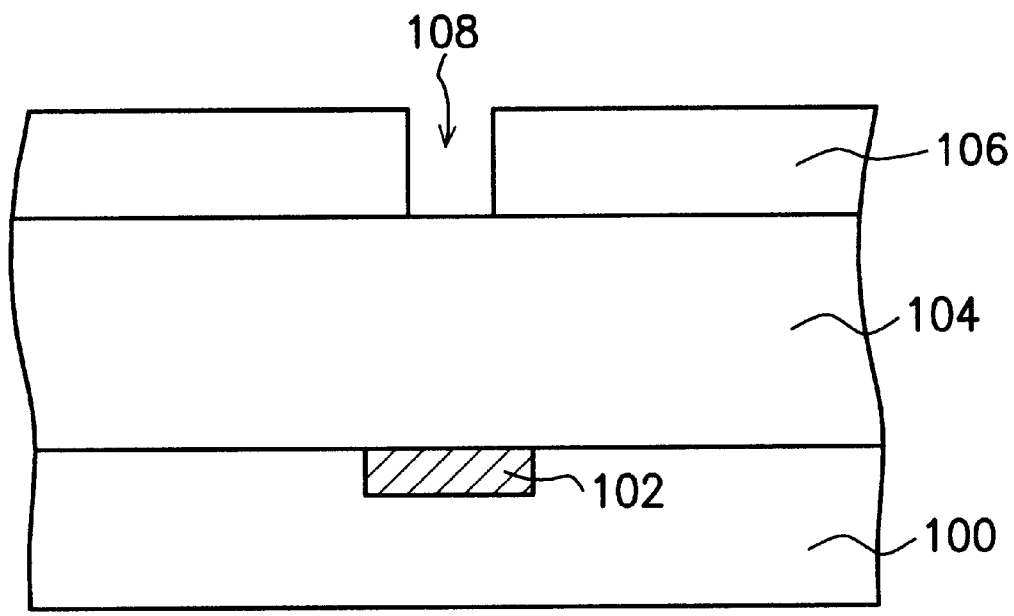
FIG. 1A–1D is a cross sectional view of the formation of an opening in a preferred embodiment according to the invention.

In FIG. 1A, a substrate 100 has device structures (not shown) and a conductive layer 102 formed on it. The conductive layer 102 is, for example, a metal layer or polysilicon with dopant. An insulating layer 104 (or dielectric layer), such as a silicon oxide layer, is formed over the substrate 100. A DUV PR layer 106 with an opening 108 is then formed on the insulating layer, with the opening 108 located over a via opening formed within the insulating layer 104 in the subsequent process. With the short wave length of deep ultra-violet light, the resolution of the light source improves and the width of the opening 108 can be narrower to follow the needs of design rule.

Figure 1B:
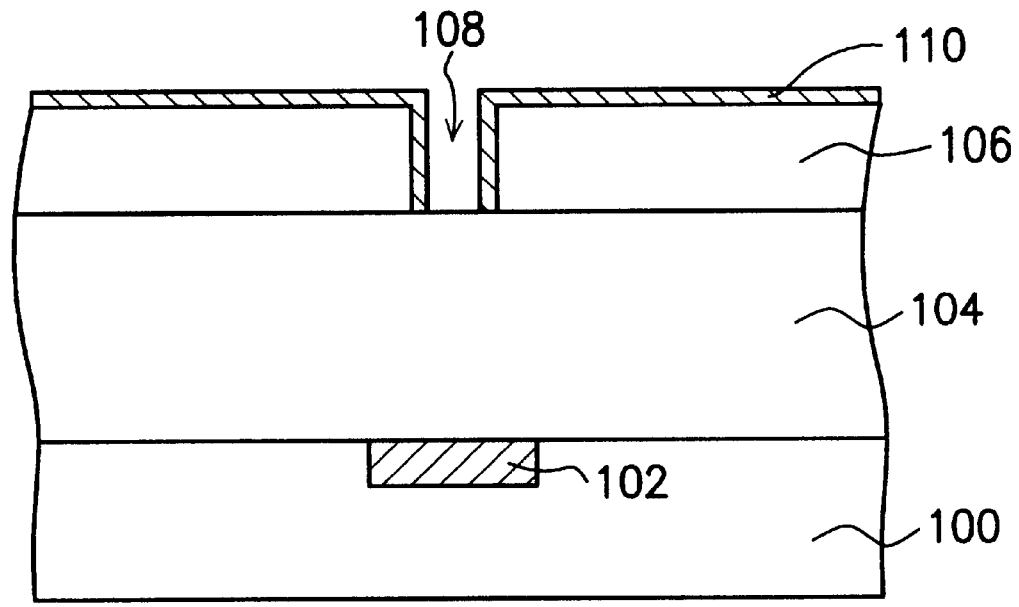
Figure 1C:
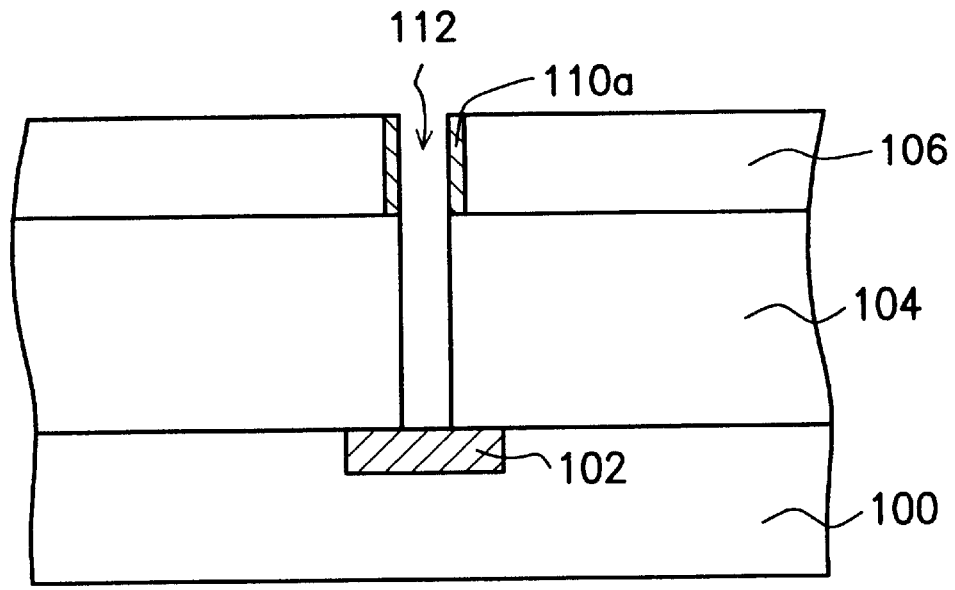

Next, in FIG. 1B a hard mask layer 110 is formed on the surface of the DUV PR 106. The hard mask layer 110 includes a silicon layer, which is formed by silylation. If a plasma treatment is performed after silylation, the silicon layer can become an oxide layer or a nitride layer as oxygen or nitrogen is pumped into the plasma chamber. The opening 108 within the DUV PR 110 is used to define the insulating layer 104, and an opening 112 is then formed within the insulating layer 104, exposing the surface of the conductive layer 102 as shown in FIG. 1C. The opening 112 can be formed by dry etching.

The material character of the DUV PR 106 is soft, and as previously mentioned, suffers erosion and reflow by etchant as the opening 112 is formed within the insulating layer 104. This makes it impossible to achieve a thoroughly vertical opening 112. The hard mask layer 110 is deliberately formed with hard material on the surface of the DUV PR 106 to protect DUV PR 106. In addition, the hard mask layer 110 is formed on the DUV PR 106 and the width of the opening 108 in FIG. 1B can be reduced. Therefore the width of the opening 112 in FIG. 1C is also narrower as the insulating layer 104 is defined by the opening 108. For example, the hard mask layer 110 swells after its formation and the width of the opening 108, designed to be about 0.25 $\mu$m wide, can be reduce to 0.15 $\mu$m because of swelling of the hard mask layer 110. This particular characteristics can improve the pattern resolution beyond the limitation of lithography. During the etching process of the opening 112, the hard mask layer 110 and the insulating layer 104 are etched at the same time. Since the material character of the hard mask layer 110 is stronger, the etching rate is slower and the DUV PR layer 106 can be protected from overetching. After the etching process, a portion of hard mask layer 110a is still left on the profile of the of the hard mask layer's 110 sidewalls because the etching rate of the hard mask layer 110 is slower than the DUV PR layer 106. The existence of the residual hard mask layer 110 can keep the profile of the sidewalls straight and the width of the opening 112 can be better controlled.

Figure 1D:
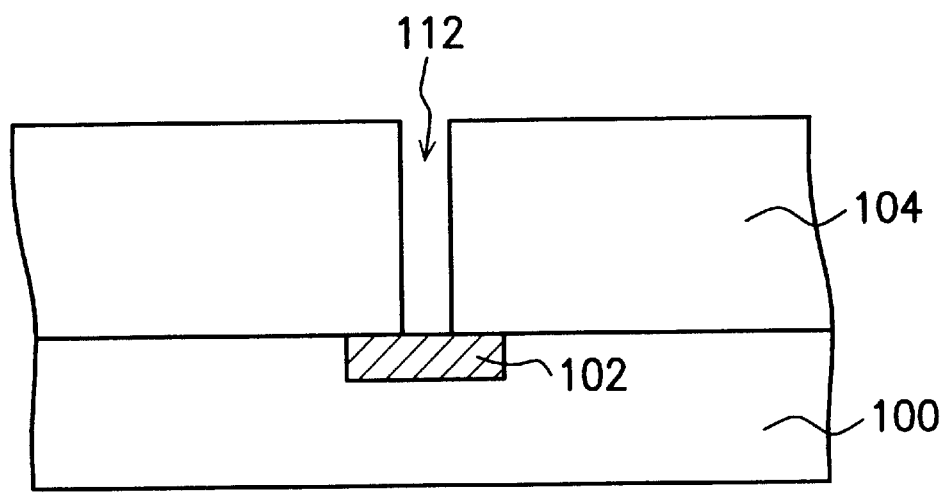

Referring to FIG. 1D, the DUV PR layer 106 and the residual hard mask layer 110a are next removed to expose the surface of the insulating layer 106 and an opening 112 with the desired width is formed. After that, a conductive layer can be deposited into the opening 112 and the subsequent process can be continued.

The opening 112 is used as a via hole, and the conductive layer is exposed after the formation of the opening 112. If the opening is formed for a contact hole, after forming the opening, the doped region is exactly exposed. Furthermore, the opening is for damascene and it usually exposes the conductive layer. Therefore this invention is applied in the formation of via holes, contact holes or even the openings for damascene.

A DUV PR layer and a silylation process are applied; as a result, a hard mask layer can be formed on the DUV PR layer after exposing the DUV PR and the hard mask layer is used to protect the DUV PR from overetching. Because the DUV PR layer and the hard mask layer have different levels of etching selectivity to overcome the problem of overetching the DUV PR, the width of the contact or via can be reduced without suffering the limitation of photolithography.

Other embodiments of the invention will appear to those skilled in the art from consideration of the specification and practice of the invention disclosed herein. It is intended that the specification and examples be considered exemplary only, with the true scope and spirit of the invention being indicated by the following claims.

What is claimed is:

1. A method of fabricating an opening wherein a substrate having a device structure is provided comprising separate steps as follows:

forming an insulating layer over the substrate;

forming a deep ultra-violet photoresist layer with a first opening on the insulating layer wherein the deep ultra-violet photoresist layer has a surface and sidewalls;

forming a hard mask layer by silylation on the surface and sidewalls of the deep ultra-violet photoresist layer in a plasma treatment step;

forming a second opening by etching a portion of the insulating layer not covered by the hard mask layer and the deep ultraviolet photoresist layer until the substrate is exposed in a dry etching step; and removing the deep ultra-violet photoresist layer and the hard mask layer to expose the insulating layer.

2. The method according to claim 1, wherein the said step of etching the insulating layer using the first opening of the deep ultra-violet photoresist layer includes etching the insulating layer by dry etching.

3. The method according to claim 1, wherein as the said step of etching the insulating layer is performed, a portion of the hard mask layer is removed from the surface of the deep ultra-violet photoresist and a portion of the hard mask layer is left on the sidewalls of the deep ultra-violet photoresist layer.

4. The method according to claim 1, wherein the hard mask layer includes a silicon layer.

5. The method according to claim 1, wherein the hard mask layer includes a silicon oxide layer.

6. The method according to claim 5, wherein the silicon oxide layer is formed after silylation and a plasma treatment is performed in the presence of oxygen.

7. The method according to claim 1, wherein the hard mask layer includes a nitride layer.

8. The method according to claim 7, wherein the nitride layer is formed after silylation and a plasma treatment is performed in the presence of nitrogen.

9. The method according to claim 1, wherein the insulating layer includes an oxide layer.

10. The method according to claim 1, wherein the step of forming a hard mask layer includes performing a silylation process on the deep ultra-violet photoresist layer so that the width of the first opening is reduced by the hard mask layer which is formed on the surface and sidewalls of the deep ultra-violet photoresist layer.

11. A method of fabricating an opening wherein a substrate having a device structure and a metal layer formed thereon is provided, comprising separate steps as follows:

forming a dielectric layer over the substrate;

forming a deep ultra-violet photoresist layer with a first opening on the dielectric layer wherein the deep ultra-violet photoresist layer has a surface and sidewalls;

forming a hard mask layer by silylation on the surface and the sidewalls of the deep ultra-violet photoresist layer in a plasma treatment step;

forming a via hole by etching the dielectric layer using the first opening of the deep ultra-violet photoresist layer to expose the metal layer; and removing the deep ultra-violet photoresist layer and the hard mask layer to expose the dielectric layer, wherein as the said step of etching the dielectric layer is performed, a portion of the hard mask layer is removed from the surface of the deep ultra-violet photoresist and a portion of the hard mask layer is left on the sidewalls of the deep ultra-violet photoresist layer.

12. The method according to claim 11, wherein the hard mask layer includes a silicon layer formed by silylation.

13. The method according to claim 11, wherein the hard mask layer includes a silicon oxide layer, which is formed after silylation, and a plasma treatment is performed with surrounding of oxygen.

14. The method according to claim 11, wherein the hard mask layer includes a nitride layer, which is formed after silylation, and a plasma treatment is performed with surrounding of nitrogen.

15. A method of fabricating an opening wherein a substrate having a device structure and a doped region formed thereon is provided, comprising separate steps as follows:

forming an insulating layer over the substrate;

forming a deep ultra-violet photoresist layer with a first opening on the insulating layer wherein the deep ultra-violet photoresist layer has a surface and sidewalls;

forming a hard mask layer by silylation on the surface and the sidewalls of the deep ultra-violet photoresist layer in a plasma treatment step;

forming a contact hole by etching the insulating layer using the first opening of the deep ultra-violet photoresist layer to expose the doped region; and removing the deep ultra-violet photoresist layer and the hard mask layer to expose the insulating layer, wherein as the said step of etching the insulating layer is performed, a portion of the hard mask layer is removed from the surface of the deep ultra-violet photoresist and a portion of the hard mask layer is left on the sidewalls of the deep ultra-violet photoresist layer.

16. The method according to claim 15, wherein the hard mask layer includes a silicon layer formed by silylation.

17. The method according to claim 15, wherein the hard mask layer includes a silicon oxide layer, which is formed after silylation, and a plasma treatment is performed in the presence of oxygen.

18. The method according to claim 15, wherein the hard mask layer includes a nitride layer, which is formed after silylation, and a plasma treatment is performed in the presence of nitrogen.

* * * * *